United States Patent
Hsu (10) Patent No.: US 9,947,389 B1
(45) Date of Patent: Apr. 17, 2018

(54) SINGLE ENDED MEMORY DEVICE

(71) Applicant: Taiwan Semiconductor Manufacturing Co., Ltd., Hsin-Chu (TW)

(72) Inventor: Kuoyuan Hsu, San Jose, CA (US)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/429,082

(22) Filed: Feb. 9, 2017

Related U.S. Application Data (60) Provisional application No. 62/428,469, filed on Nov. 30, 2016.

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC .............................. G11C 11/419; G11C 16/10
USPC .............................................. 365/154, 185.24
See application file for complete search history.

(56) References Cited

U.S. PATENT DOCUMENTS

| | | | |
|---|---|---|---|
| 8,605,523 B2 | 12/2013 | Tao et al. | |
| 8,630,132 B2 | 1/2014 | Cheng et al. | |
| 8,760,948 B2 | 6/2014 | Tao et al. | |
| 8,908,421 B2 | 12/2014 | Liaw | |
| 8,929,160 B2 | 1/2015 | Katoch et al. | |
| 8,964,492 B2 | 2/2015 | Hsu et al. | |
| 8,982,643 B2 | 3/2015 | Lum | |
| 9,117,510 B2 | 8/2015 | Yang et al. | |
| 9,208,858 B1 | 12/2015 | Lin et al. | |
| 9,218,872 B1 | 12/2015 | Liaw | |
| 2006/0206739 A1* | 9/2006 | Kim | G11C 11/412 713/322 |
| 2008/0111616 A1* | 5/2008 | Cheng | G01R 31/3008 327/543 |
| 2010/0238000 A1* | 9/2010 | Hung | G06K 19/07749 340/10.4 |
| 2010/0284210 A1* | 11/2010 | Chen | G11C 17/16 365/104 |
| 2013/0094309 A1* | 4/2013 | Wang | G11C 11/419 365/191 |
| 2013/0163312 A1* | 6/2013 | Chang | G11C 11/413 365/156 |
| 2014/0078831 A1* | 3/2014 | Mietus | G11C 16/06 365/185.21 |
| 2014/0153345 A1 | 6/2014 | Kim et al. | |
| 2014/0233330 A1 | 8/2014 | Ko et al. | |

(Continued)

*Primary Examiner* — Michael Tran
(74) *Attorney, Agent, or Firm* — Duane Morris LLP (57) ABSTRACT

A memory device includes a memory cell that is configured to store a data bit, comprising at least one read transistor that is configured to form either a discharging path or a leakage path when the data bit is read; a conductive line coupled to the read transistor; and at least a first track transistor, coupled to the conductive line, and configured to provide a first current signal having a first current level that tracks a second current level of a second current signal, wherein the second current signal is provided when either one of the discharging and leakage paths is formed, and wherein the first the second current signals are used to determine a logical state of the data bit.

20 Claims, 4 Drawing Sheets

(56) References Cited

U.S. PATENT DOCUMENTS

| | | | |
|---|---|---|---|
| 2015/0029803 A1* | 1/2015 | Fredeman | G11C 7/12 |
| | | | 365/203 |
| 2015/0092502 A1* | 4/2015 | Yang | G11C 7/08 |
| | | | 365/191 |
| 2015/0287464 A1* | 10/2015 | Yu | G11C 16/10 |
| | | | 365/185.28 |
| 2015/0348598 A1 | 12/2015 | Wang et al. | |
| 2015/0371702 A1 | 12/2015 | Wu et al. | |
| 2015/0380077 A1 | 12/2015 | Wu et al. | |
| 2015/0380078 A1 | 12/2015 | Liaw | |
| 2016/0042791 A1* | 2/2016 | Sakui | G11C 16/0483 |
| | | | 365/185.05 |
| 2016/0064059 A1* | 3/2016 | Takahashi | G11C 11/1675 |
| | | | 365/158 |
| 2016/0111146 A1* | 4/2016 | Pan | G11C 11/406 |
| | | | 365/72 |
| 2016/0172059 A1* | 6/2016 | Arslan | G11C 13/004 |
| | | | 365/148 |
| 2016/0225437 A1* | 8/2016 | Kumar | G11C 11/419 |
| 2016/0284388 A1* | 9/2016 | Hsu | G11C 29/50016 |
| 2017/0052839 A1* | 2/2017 | Park | G06F 11/0793 |
| 2017/0125086 A1* | 5/2017 | Yang | G11C 11/419 |

* cited by examiner

SINGLE ENDED MEMORY DEVICE

CROSS-REFERENCE TO RELATED APPLICATION

The present application claims priority to U.S. Provisional Patent Application No. 62/428,469, filed on Nov. 30, 2016, which is incorporated by reference herein in its entirety.

BACKGROUND

Static random access memory (SRAM) devices are well-suited for providing working data storage, such as cache memory for processors. Recent system on a chip (SoC) designs often incorporate one, two or more "core processors," which are predesigned processors such as DSP's, RISC or ARM microprocessors, for example. These core processors are often arranged with a level one (L1) cache memory of SRAM cells laid out near or adjacent to the processor to enable fast processor operations. In many devices in which a dual-core approach is used, such as a radio transceiver integrated circuit, for example, at least one of the radio transceiver's cores may be implemented as a microprocessor core. Several SRAM arrays, each array including a plurality of bit cells, may be used in such integrated circuits.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

A typical SRAM bit cell is arranged as a six transistor (6T) bit cell (or a 6T memory bit cell). Generally, in a 6T bit cell, read and write operations are performed through a single port and thus the 6T bit cell is categorized as a single-port bit cell. Due to the sharing of the single port for both read and write operations, a variety of issues may occur such as, for example, a data upset, a read disturbance, etc. To address such issues, some alternative arrangements of bit cells have been proposed, for example, a dual-port eight transistor (2P-8T) SRAM bit cell (hereinafter a "2P-8T bit cell") including two separate ports for read and write operations, respectively. Advantages of a separate read port are that the possibility of read disturbance is reduced, because a data bit stored in such a 2P-8T bit cell is not affected by a read operation.

To retrieve a data bit from such a dual-port bit cell (e.g., a 2P-8T bit cell), an input/output (I/O) circuit (e.g., a sensing amplifier) is generally used to read out the data through either a bit line (BL) or a bit bar line (BBL) of the bit cell, i.e., a single dedicated BL or BBL. Thus, a 2P-8T bit cell is typically categorized as a "single-ended" memory bit cell, compared to the 6T bit cell that is generally categorized as a "differential-ended" memory bit cell. Reading the data bit through a single BL or a BBL typically uses a keeper circuit coupled to the dedicated BL or BBL. In general, the keeper circuit is configured to provide a reference signal (e.g., a reference current) that is designed to have a current level between a turn-on current ($I_{on}$) and a turn-off current ($I_{off}$). As understood by people of ordinary skill in the art, $I_{on}$ and $I_{off}$ refer to a discharging current and a leakage current, respectively. More specifically, the discharging current ($I_{on}$) and the leakage current ($I_{off}$) correspond to reading a logical low state and a logical high state, respectively, from a 2P-8T bit cell. Since the current level of the reference current is supposed to preset between the current levels of $I_{on}$ and $I_{off}$, the sensing amplifier does not need wait for a full voltage swing (e.g., from Vdd to ground) present on the dedicated BL (or BBL) to read out a logical state of the data bit.

However, the current level of the reference circuit, provided by the conventional keeper circuit, is generally preset to a relatively constant value. Accordingly, the current level of the reference current may not be dynamically reflected in view of change(s) of $I_{on}$ and/or $I_{off}$. For example, sometimes the current level of the reference current may exceed above the current level of $I_{on}$ when the bit cell operates under a relatively low voltage (e.g., about 70% of Vdd), and sometimes the current level of the reference current may fall below the current level of $I_{off}$ when the bit cell operates under a relatively high voltage (e.g., about 140% of Vdd), wherein Vdd is a unified voltage reference or a power supply voltage applied to the bit cell. As such, the sensing amplifier cannot use the reference current as a "reference" to differentiate $I_{on}$ and/or $I_{off}$ thereby resulting in a failure to read the logical state of the data bit in the bit cell. Although the above-identified issue occurs for a 2P-8T bit cell, as described, it is noted that such an issue typically occurs in various single-ended memory cells such as, for example, a single-ended 10T SRAM memory cell, a single-ended read only memory (ROM) cell, etc. For brevity, the following discussion will continue using the 2P-8T bit cell as an exemplary embodiment.

The present disclosure provides various embodiments of a memory architecture (device) that includes a reference circuit coupled to a memory array. In some embodiments, the memory array includes a plurality of single-ended 2P-8T bit cells (hereinafter "bit cells"), wherein each bit cell is coupled to a dedicated read bit line (hereinafter "RBL") that is configured to provide a read path for a respective sensing amplifier to read out a logical state of the data bit present in the bit cell. More specifically, the bit cell includes a read driver transistor and a read transistor, both coupled to the RBL. In some embodiments, the read driver and read transistors are configured to perform a read operation of the bit cell by completing the read path with either a discharging path or a leakage path based on the logical state of the data bit. The discharging path may be provided when a first logical state of the data bit is read out from the bit cell; the leakage path may be provided when a second logical state of the data bit is read out from the bit cell. Accordingly, the discharging path is associated with a discharging current (hereinafter "$I_{on}$") present on the RBL; and the leakage path is associated with a leakage current (hereinafter "$I_{off}$") present on the RBL.

According to various embodiments of the present disclosure, the reference circuit includes one or more transistors that are each substantially identical to the read driver and read transistors in terms of structures (e.g., physical dimensions of the channel, the gate electrode, the gate oxide, etc.), device profiles (e.g., materials used for the gate electrode, the gate oxide, doping concentrations/profiles for the drains/sources, etc.), etc. As such, a reference current (hereinafter "$I_{ref}$") provided by the reference circuit may "track" the $I_{on}$ and $I_{off}$. That is, even though the bit cell is accessed under a wide range of operation windows (e.g., from a relatively low voltage (70% of Vdd) to a relatively high voltage (140% of Vdd)), the current level of $I_{ref}$ can still be sandwiched between current levels of $I_{on}$ and $I_{off}$, and moreover, a respective difference between the current levels of the $I_{ref}$ and $I_{on}$ or $I_{off}$ can remain substantially constant, in accordance with some embodiments. Accordingly, the above-described issue about the read failure, which commonly occurs in conventional single-ended memory cells, can be avoided by using the disclosed memory device. Also, in some embodiments, the reference circuit includes several sub-circuits that can further optimize an overall performance of the currently disclosed memory device such as, for example, ultra-low stand-by power consumption of the reference circuit, a short responsive time of the reference circuit, etc., which will be discussed in further detail below.

Figure 1:
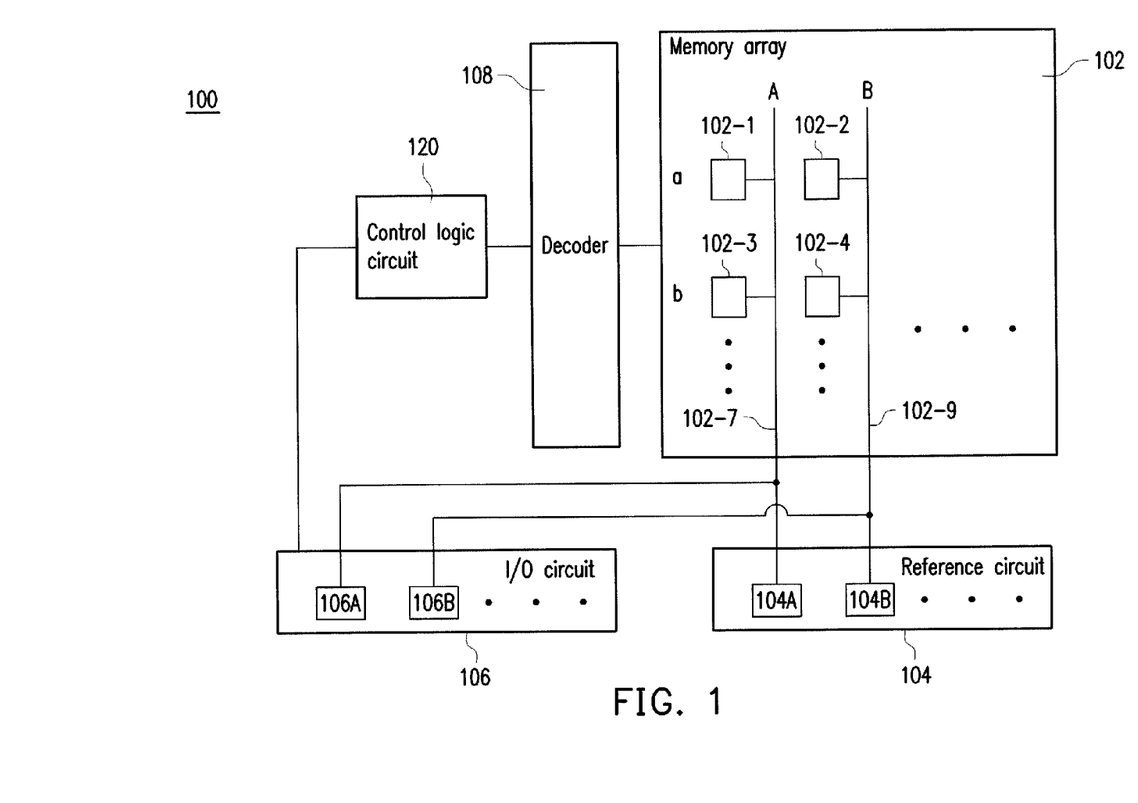
FIG. 1 illustrates an exemplary block diagram of a memory device that includes a memory array coupled with a reference circuit, in accordance with some embodiments.

FIG. 1 illustrates an exemplary schematic diagram of a memory device 100 that includes a memory array 102 and a reference circuit 104 coupled to the memory array 102, in accordance with various embodiments. Further, the memory device 100 includes an input/output (I/O) circuit 106 and a decoder 108 respectively coupled to the memory array 102, and a control logic circuit 120 coupled to the reference circuit 104, the I/O circuit 106, and the decoder 108. It is noted that the illustrated embodiment of FIG. 1 is merely an example so that only one memory array (e.g., 102) and components that are related to the current embodiment (e.g., the reference circuit 104, the I/O circuit 106, the decoder 108, and the control logic circuit 120) are shown. Additional memory arrays and one or more other components such as, for example, a buffer circuit, a timing circuit, etc., may be included in the memory device 100 while remaining within the scope of the present disclosure.

More specifically, the memory array 102 includes a plurality of bit cells, and each bit cell includes a 2P-8T bit cell, as mentioned above. The plurality of bit cells are arranged in a column-row configuration, wherein each bit cell is arranged at an intersection of a corresponding column and a corresponding row. Each bit cell is configured to present/store a data bit, i.e., either at a logical high state (e.g., a logical 1) or at a logical low state (e.g., a logical 0). Moreover, the memory array 102 includes a plurality of bit lines (BL's) and/or bit bar lines (BBL's) arranged along respective columns, and a plurality of word lines (WL's) arranged along respective rows. For clarity, only a BL is shown along each column in the illustrated embodiment of FIG. 1. Other BL's/BBL's along each column and WL's along each row will be shown and described in further detail below with respect to FIGS. 2A and 2B.

For example, the memory array 102 includes bit cells 102-1, 102-2, 102-3, and 102-4, wherein the bit cells 102-1 and 102-2 are arranged along a first row, row "a;" the bit cells 102-3 and 102-4 are arranged along a second row, row "b." And bit cells along a same row are arranged in a separate and different column, respectively. For example, bit cells 102-1 and 102-2 along row a are respectively arranged in first and second columns, columns "A" and "B;" and bit cells 102-3 and 102-4 along row b are respectively arranged in columns A and B. More specifically, column A includes a BL 102-7 that is coupled to the bit cells along column A (e.g., 102-1, 102-3, etc.); column B includes a BL 102-9 that is coupled to the bit cells along column B (e.g., 102-2, 102-4, etc.). As described above, each 2P-8T bit cell is coupled to a dedicated BL for read operations, i.e., the read bit line (RBL). In the illustrated embodiment of FIG. 1, each of the BL's (102-7 and 102-9) is the RBL along the respective column. Although only two columns and two rows are shown in FIG. 1, the memory array 102 may include any desired number of columns and rows, respectively, while remaining within the scope of the present disclosure. Thus, the memory array 102 may include any desired number of RBL's that is reflected in view of the number of columns of the memory array 102.

Further to the illustrated embodiment of FIG. 1, each column (or RBL) of the memory array 102 is coupled to a corresponding sub-reference circuit of the reference circuit 104 and a corresponding sensing amplifier of the I/O circuit 106. As shown, column A (and each bit cell along column A: 102-1, 102-3, etc.) is coupled to sub-reference circuit 104A of the reference circuit 104 and sensing amplifier 106A of the I/O circuit 106 through the RBL 102-7; column B (and each bit cell along column B: 102-2, 102-4, etc.) is coupled to sub-reference circuit 104B of the reference circuit 104 and sensing amplifier 106B of the I/O circuit 106 through the RBL 102-9. Similarly, a number of sub-reference circuits (104A, 104B, etc.) and a number of sensing amplifiers (106A, 106B, etc.) are each reflected in view of the number of columns (i.e., RBL's) of the memory array 102 so that in the illustrated embodiment of FIG. 1, only two sub-reference circuits (104A and 104B) and two sensing amplifiers (106A and 106B) are respectively shown in the reference circuit 104 and the I/O circuit 106.

As described above, WL's of the memory array 102 are not shown in FIG. 1 and the illustrated BL's are referred to as RBL's. According to some embodiments of the present disclosure, in addition to the illustrated RBL's (102-7, 102-9, etc.), each column of the memory array 102 may include at least one BL and one BBL, and each row of the memory array 102 may include at least two WL's. In such an embodiment, each bit cell is coupled to at least two WL's and three BL's (one RBL, one BL, and one BBL). More specifically, the BL and BBL included in each column are configured to be used during a write operation for the bit cells of that column. In some embodiments the BL and BBL are referred to as "a write bit line (WBL)" and "a write bit bar line (WBBL)," respectively, which will be described in further detail below with respect to FIGS. 2A and 2B. The at least two WL's included in each row are for the use of read and write operations, respectively, which are typically referred to as "read word line (RWL)" and "write word line (WWL)," respectively. In some embodiments, the above-described RWL, WWL, WBL, WBBL, and the RBL are formed of a conductive material such as, for example, copper (Cu), aluminum (Al), gold (Au), poly-silicon, or a combination thereof. Details of the RWL and WLL will also be described in further detail below with respect to FIGS. 2A and 2B.

In some embodiments, each memory array's coupled decoder may be configured to assert one or more of the above-mentioned RWL's and WWL's (along rows) in response to a reception of addressing information (e.g., a row address) provided by the control logic circuit 120. For example, the decoder 108 may be configured to assert one or more RWL's and/or WWL's of the memory array 102. Further, the control logic circuit 120 may be coupled to the I/O circuit 106 so as to retrieve logical states of data bits read out by the sensing amplifiers (e.g., 106A, 106B, etc.) during a read operation.

Figure 2A:
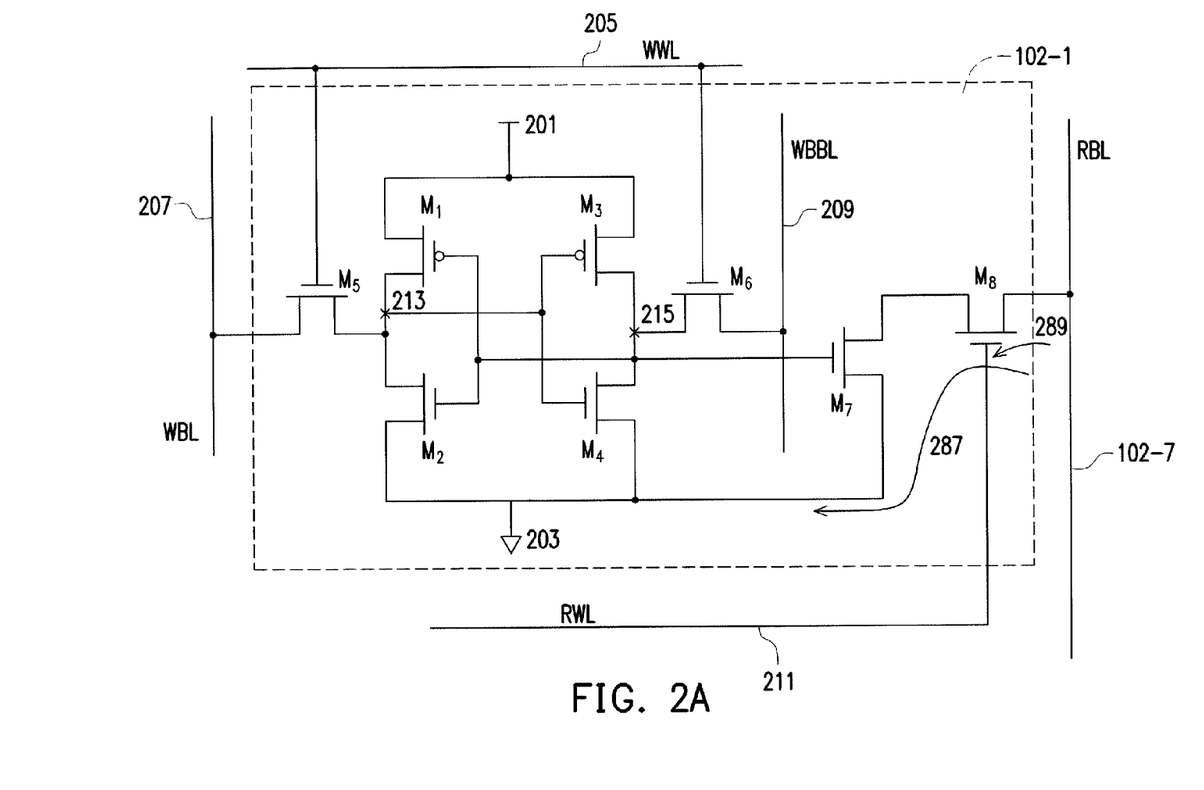
FIGS. 2A and 2B illustrate exemplary circuit diagrams of a bit cell of the memory array and a sub-reference circuit of the reference circuit of FIG. 1, respectively, in accordance with some embodiments.
Figure 2B:
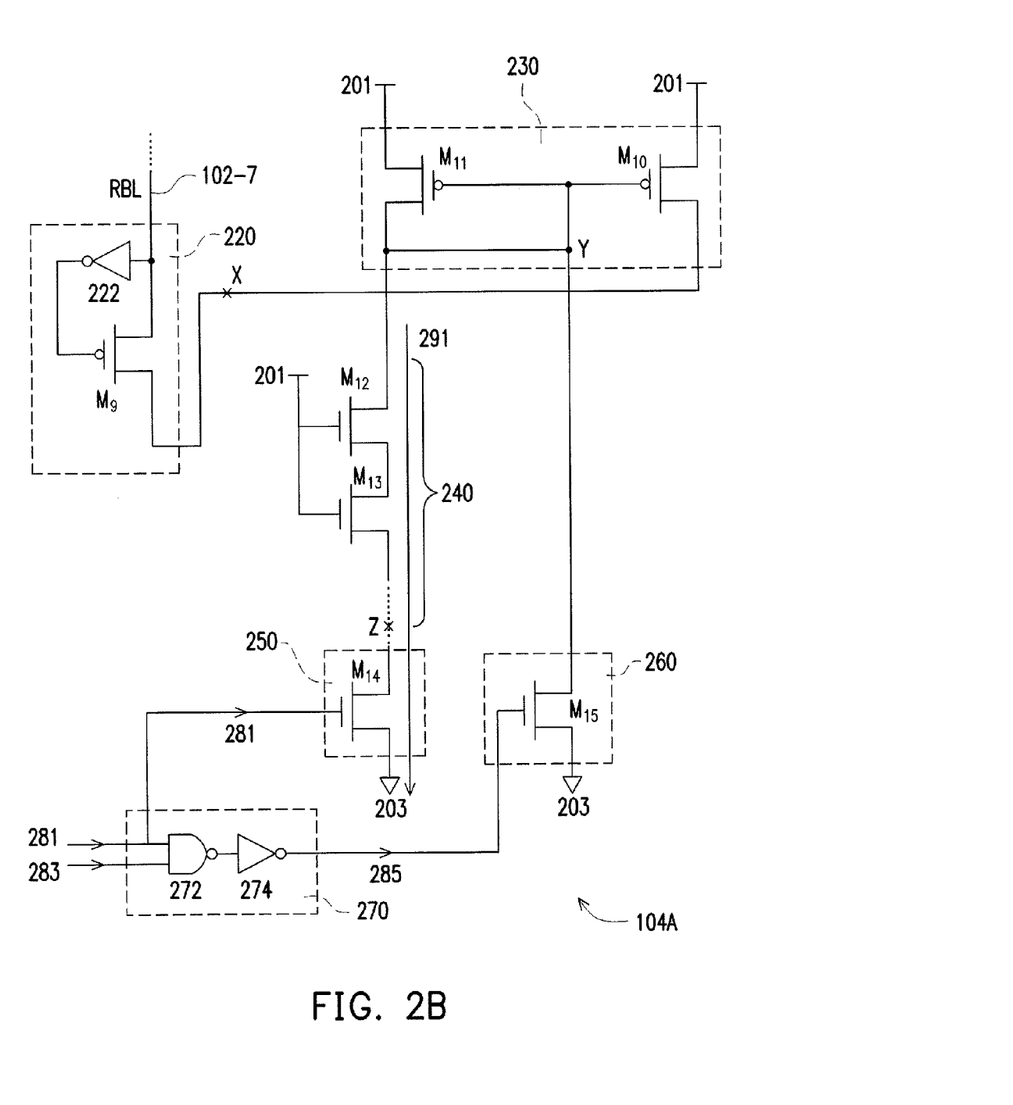

FIGS. 2A and 2B are exemplary circuit diagrams illustrating embodiments of the bit cell 102-1 and the coupled sub-reference circuit 104A, respectively. According to some embodiments of the present disclosure, the bit cells included in the memory array 102 are substantially similar to one another. Thus, for brevity, only the bit cell 102-1 and its coupled sub-reference circuit 104A are shown in FIGS. 2A and 2B, and used as a representative example for discussion of operations of the memory device 100.

As mentioned above, each of the bit cells of the memory arrays 102 is implemented as a 2P-8T bit cell. Although the cell bits are each implemented as a 2P-8T bit cell, the bit cell (e.g., 102-2, 102-3, 102-4, etc.) of the memory array 102 is not limited to being implemented as a 2P-8T bit cell. The bit cell of the memory array 102 may be implemented as any of a variety of bit cells such as, for example, a single-ended nine transistor (9T) bit cell, a read only memory (ROM) bit cell, etc.

In the illustrated embodiment of the bit cell 102-1, the bit cell 102-1 includes 8 transistors: $M_1$, $M_2$, $M_3$, $M_4$, $M_5$, $M_6$, $M_7$, and $M_8$. In some embodiments, read and write operations are performed through a respective port in a 2P-8T bit cell. In the illustrated embodiment of the bit cell 102-1, the transistors $M_1$-$M_6$ constitute a six transistor (6T) core of the 2P-8T bit cell that is mainly configured to perform the write operation (i.e., a write port included in the 6T core). The transistors $M_7$ and $M_8$ constitute a read buffer of the 2P-8T bit cell that is mainly configured to perform the read operation (i.e., a read port included in the read buffer). Details of the layout and operation of the bit cell 102-1 will be described below.

In the 6T core of the bit cell 102-1, the transistor $M_1$ and $M_2$ are formed as a first inverter and the transistors $M_3$ and $M_4$ are formed as a second inverter, wherein the first and second inverters are cross-coupled to each other, as shown. More specifically, the first and second inverters are each coupled between a first voltage reference 201 and a second voltage reference 203. Generally, the first voltage reference 201 is a voltage level of a supply voltage applied on the cell bits of the memory array 102. The first voltage reference 201 is typically referred to as "Vdd." The second voltage reference 203 is typically referred to as "ground." Further, in some embodiments, the first inverter is coupled to the transistor $M_5$, and the second inverter is coupled to the transistor $M_6$. In addition to being coupled to the inverters, the transistors $M_5$ and $M_6$ are both coupled to a write word line (WWL) 205 of the memory array 102 and each coupled to a write bit line (WBL) 207 and a write bit bar line (WBBL) 209, respectively. In some embodiments, the transistors $M_5$ and $M_6$ are gated (i.e., turned on or off) by the WWL 205. Typically, the transistors $M_1$ and $M_3$ are referred to as pull-up transistors of the bit cell 102-1; the transistors $M_2$ and $M_4$ are referred to as pull-down transistors of the bit cell 102-1; the transistors $M_5$ and $M_6$ are referred to as access transistors of the bit cell 102-1. In some embodiments, the transistors $M_2$, $M_4$, $M_5$, and $M_6$ each includes an NMOS transistor, and $M_1$ and $M_3$ each includes a PMOS transistor. Although the illustrated embodiments of FIG. 2A shows that $M_1$-$M_6$ are either NMOS or PMOS transistors, any of a variety of transistors or devices that are suitable for use in a memory device may be implemented as at least one of $M_1$-$M_6$ such as, for example, a bipolar junction transistor (BJT), a high-electron mobility transistor (HEMT), etc.

Referring still to FIG. 2A, in the illustrated embodiment of the read buffer, i.e., the transistors $M_7$ and $M_8$, of the bit cell 102-1, the transistors $M_7$ and $M_8$ are serially connected between the voltage reference 203 (ground) and the RBL 102-7. Typically, the transistor $M_7$ is referred to as a read driver transistor of the bit cell 102-1; and the transistor $M_8$ is referred to as a read transistor of the bit cell 102-1. Further, in some embodiments, the read transistor $M_8$ is gated (i.e., turned on or off) by a read word line (RWL) 211 to read a data bit stored in the 6T core by way of generating a conduction path, provided by the read driver transistor $M_7$, to the RBL 102-7. Details of the operation (e.g., the read operation) of the bit cell 102-1 will be described below. Similarly, although the illustrated embodiments of FIG. 2A shows that $M_7$ and $M_8$ are NMOS transistors, any of a variety of transistors or devices that are suitable for use in a memory device may be implemented as at least one of $M_7$-$M_8$ such as, for example, a bipolar junction transistor (BJT), a high-electron mobility transistor (HEMT), etc.

Referring now to the illustrated embodiment of the sub-reference circuit 104A of FIG. 2B, the sub-reference circuit 104A is coupled to the bit cells along column A through the RBL 102-7, which is also shown in FIG. 1. As shown, the sub-reference circuit 104A includes a switch circuit 220, a current mirror circuit 230, a current track circuit 240, a stand-by circuit 250, a wake-up circuit 260, and a pulse generation circuit 270, in accordance with various embodiments.

In some embodiments, the switch circuit includes a transistor $M_9$ and an inverter 222. More specifically, an input of the inverter 222 and a source of the transistor $M_9$ are each coupled to the RBL 102-7, an output of the inverter 222 is coupled to a gate of the transistor $M_9$, and a drain of the transistor $M_9$ is coupled to a node "X." The node X is coupled to the current mirror circuit 230. Although the illustrated embodiments of FIG. 2B shows that $M_9$ is a PMOS transistor, any of a variety of transistors or devices that are suitable for use in a memory device may be implemented as $M_9$ such as, for example, a bipolar junction transistor (BJT), a high-electron mobility transistor (HEMT), etc.

In some embodiments, the current mirror circuit 230 includes two common-gated transistors $M_{10}$ and $M_{11}$, i.e., gates of the transistors $M_{10}$ and $M_{11}$ are coupled with each other to serve as a current mirror circuit. More specifically, sources of the transistors $M_{10}$ and $M_{11}$ are both coupled to the first voltage reference 201 (Vdd), the gates of the transistors $M_{10}$ and $M_{11}$ are coupled to a common node "Y" that is also coupled to the wake-up circuit 260, a drain of the transistor $M_{10}$ is coupled to the node X (i.e., the switch circuit 220), and a drain of the transistor $M_{11}$ is coupled to its own gate (i.e., node Y) and the current track circuit 240. Although the illustrated embodiments of FIG. 2B shows that $M_{10}$ and $M_{11}$ are PMOS transistors, any of a variety of transistors or devices that are suitable for use in a memory device may be implemented as at least one of $M_{10}$-$M_{11}$ such as, for example, a bipolar junction transistor (BJT), a high-electron mobility transistor (HEMT), etc.

According to various embodiments of the present disclosure, the current track circuit 240 includes one or more transistors, e.g., $M_{12}$, $M_{13}$, etc., that are serially coupled to one another, and are coupled between the current mirror circuit 230 (i.e., at the node Y) and the stand-by circuit 250 at a node "Z." More specifically, gates of the one or more transistors ($M_{12}$, $M_{13}$, etc.) are respectively coupled to the first voltage reference 201 (Vdd). Although the illustrated embodiments of FIG. 2B shows that $M_{12}$ and $M_{13}$ are NMOS transistors, any of a variety of transistors or devices that are suitable for use in a memory device may be implemented as at least one of $M_{12}$-$M_{13}$ such as, for example, a bipolar junction transistor (BJT), a high-electron mobility transistor (HEMT), etc.

In some embodiments, the current track circuit 240 is configured to provide the above-mentioned reference current, $I_{ref}$. Further, each of the transistors of the current track circuit 240 is substantially identical to the read driver transistor $M_7$ and the read transistor $M_8$ such that the current level of $I_{ref}$ can dynamically track the current levels of $I_{on}$ and $I_{off}$ of the bit cell 102-1, which correspond to reading a logical 0 and a logical 1, respectively. Operations of the current track circuit 240, together with other circuits of the sub-reference circuit 104A, will be discussed in further detail below.

Referring still to FIG. 2B, the stand-by circuit 250 includes a transistor $M_{14}$. More specifically, a drain of the transistor $M_{14}$ is coupled to the current track circuit 240 at the node Z, the transistor $M_{14}$ is gated by a global enable signal 281 (which will be discussed below), and a source of the transistor $M_{14}$ is coupled to the second voltage reference 203 (ground). Similarly, although $M_{14}$ is an NMOS transistor, any of a variety of transistors or devices that are suitable for use in a memory device may be implemented as $M_{14}$ such as, for example, a bipolar junction transistor (BJT), a high-electron mobility transistor (HEMT), etc. In some embodiments, the stand-by circuit 250 is configured to provide ultra-low (e.g., zero) stand-by power consumption to sub-reference circuit 104A, in turn the memory device 100 as a whole, when the data bit stored in the bit cell 102-1 is not being accessed. Although the stand-by circuit 250 includes only one transistor (e.g., $M_{14}$) in the illustrated embodiment of FIG. 2B, in some other embodiments, the stand-by circuit 250 may include plural transistors and/or one or more circuit components as long as the stand-by circuit 250 can provide zero stand-by power consumption.

The wake-up circuit 260 includes a transistor $M_{15}$. More specifically, a drain of the transistor $M_{15}$ is coupled to the current mirror circuit 230 at the node Y, the transistor $M_{15}$ is gated by a short pulse signal 285 (which will be discussed below), and a source of the transistor $M_{15}$ is coupled to the second voltage reference 203 (ground). Although $M_{15}$ is an NMOS transistors, as shown, any of a variety of transistors or devices that are suitable for use in a memory device may be implemented as $M_{15}$ such as, for example, a bipolar junction transistor (BJT), a high-electron mobility transistor (HEMT), etc. In some embodiments, the wake-up circuit 260 is configured to wake up (i.e., turn on) the transistors $M_{10}$ and $M_{11}$ of the current mirror circuit 240 quickly when the data bit stored in the bit cell 102-1 is accessed. Similarly, although the wake-up circuit 260 includes only one transistor (e.g., $M_{15}$) in the illustrated embodiment of FIG. 2B, in some other embodiments, the wake-up circuit 260 may include plural transistors and/or one or more circuit components as long as the wake-up circuit 260 can wake up the current mirror circuit 230 quickly.

The pulse generation circuit 270 includes a NAND logic gate 272, and an inverter 274 serially coupled to an output of the NAND logic gate 272. In some embodiments, the pulse generation circuit 270 is configured to generate a short pulse signal 285 by using a global enable signal 281 and a global disenable signal 283. More specifically, the NAND logic gate 272 is configured to receive the global enable signal 281 and the global disenable signal 283 at its inputs, perform a NAND logic function on the signals 281 and 283 so as to generate a NAND'ed signal that lasts for a substantially short pulse width (e.g., about 10 picoseconds), and provide the NAND'ed signal to the coupled inverter 274. The inverter 274 then provides the short pulse signal 285 that is logically complementary to the NAND'ed signal.

In some embodiments, the global enable signal 281 transitions from a logical low state (hereinafter "LOW") to a logical high state (hereinafter "HIGH") within a very short period of time (e.g., about 20 to 30 picoseconds), and the global disenable signal 283 transitions from HIGH to LOW within the same period of time when the bit cell 102-1 is accessed, or more generally, when the memory array 102 is accessed. By using such global enable/disenable signals 281/283 with a steep transition, in some embodiments, the short pulse signal 285 may have substantially similar rising and falling edges to the global enable/disenable signals 281/283, and can thus turn on and then off the transistor $M_{15}$ of the wake-up circuit 260 quickly. In response to the steep rising edge of the short pulse signal 285, the transistors $M_{10}$ and $M_{11}$ can be quickly woken up (i.e., turned on) by pulling down a voltage at the node Y to ground (i.e., the second voltage reference 203). After a short period of time (i.e., the short pulse width of the signal 285, which is about 10 picoseconds), and in response to the falling edge of the short pulse signal 285, the transistor $M_{15}$ is turned off so that the gates of the transistors $M_{10}$ and $M_{11}$, i.e., the voltage at the node Y, are left floating. Accordingly, in some embodiments, the voltage at the node Y may gradually increase to a "reference voltage level (RVL)," that is about 70% of Vdd. The RVL can be used by the current track circuit 240 to provide the above-mentioned $I_{ref}$ having the current levels that dynamically tracks the current levels of $I_{on}$ and $I_{off}$ of the bit cell 102-1, which will be discussed in further detail below.

Before further discussing the operation of the sub-reference circuit 104A, for purposes of clarity, the read operation of the bit cell 101-2 will be briefly described. In general, when a bit cell (e.g., 102-1) stores a data bit, a first node of the bit cell is configured to be at a first logical state (either a logical 1 or a logical 0), and a second node of the bit cell is configured to be at a second logical state (either a logical 0 or a logical 1), wherein the first and second logical states are logically complementary with each other. In some embodiments, the first logical state at the first node is the logical state of the data bit stored by the bit cell. For example, in the illustrated embodiment of FIG. 2A, when the bit cell 102-1 stores (presents) a logical 0, node 213 is configured to be at the logical 0 state, and node 215 is configured to be at the logical 1 state. Similarly, when the bit cell 102-1 stores (presents) a logical 1, the node 213 is configured to be at the logical 1 state, and the node 215 is configured to be at the logical 0 state.

As described above, when the memory array 102 is accessed, the global enable signal 281 (FIG. 2B) transitions from LOW to HIGH, and the global disenable signal 283 (FIG. 2B) transitions from HIGH to LOW. Prior to, simultaneously with, or subsequently to the transitions of the global signals 281 and 283, in some embodiments, to read out a data bit from the bit cell 102-1, the RWL 211, and the RBL 102-7 are pre-charged to Vdd (201), respectively, i.e., HIGH. As such, the read transistor $M_8$ is turned on by the pre-charged RWL 211, which typically refers to an open read port of the bit cell.

In an example in which the bit cell 102-1 stores a logical 0 to be read out, the node 213 is at LOW and the node 215 is at HIGH, as described above. As such, an output of the first inverter constituted of the transistors $M_1$ and $M_2$, i.e., the node 215, is at HIGH. Accordingly, the read driver transistor $M_7$ is turned on since the gate of the transistor $M_7$ is tied to the node 215. A discharging path 287 is then formed: from the pre-charged RBL 102-7, through the read transistor $M_8$, and the read driver transistor $M_7$, and to ground (203). Since the RBL 102-7 is pre-charged to Vdd and the source of the read driver transistor $M_7$ is coupled to ground, such a discharging path 287 may be associated with a rate of a varying voltage level present on the RBL 102-7 that discharges from Vdd to ground. It is understood by people of ordinary skill in the art that such a "discharging" rate is typically referred to as $I_{on}$ of the bit cell 102-1.

In another example in which the bit cell 102-1 stores a logical 1 to be read out, the node 213 is at HIGH and the node 215 is at LOW. The read driver transistor $M_7$ is accordingly turned off since the gate of the transistor $M_7$ is tied to the node 215. As such, the read transistor $M_8$ is disconnected from ground (203), and left floating. In some embodiments, a leakage path 289 is then formed: from the RBL 102-7, through (the gate of) the read transistor $M_8$, and to the RWL 211. Since the RBL 102-7 and RWL 211 are both pre-charged to Vdd, such a leakage path 289 may be associated with a rate of a varying voltage level present on the RBL 102-7 that varies around Vdd (e.g., discharging slightly from Vdd). It is understood by people of ordinary skill in the art that such a "leakage" rate is typically referred to as $I_{off}$ of the bit cell 102-1, wherein, in some embodiments, the current level of $I_{off}$ is substantially lower than the current level of $I_{on}$.

When the data bit present in the bit cell 102-1 is read out, regardless of the logical state of the data bit, the RBL 102-7 is configured to be pre-charged to Vdd, i.e., at HIGH. As such, referring again to FIG. 2B, the switch circuit 220 is turned on, which allows the RBL 102-7 to be connected to the node X. As mentioned above, prior to, simultaneously with, or subsequently to the RBL 102-7 being asserted to HIGH, the global enable signal 281 transitions from LOW to HIGH, which turns on the transistor $M_{14}$ of the stand-by circuit 250. More specifically, since the NMOS transistors (e.g., $M_{12}$, $M_{13}$, etc.) of the current track circuit 240 are gated by Vdd (201), the NMOS transistor(s) $M_{12}$ and $M_{13}$ are turned on already. Accordingly, a "current track" path 291, and a current that flows through the current tack path 291 are established. In some embodiments, such a current is referred to as the reference current, $I_{ref}$. And the current level of $I_{ref}$ is determined based on a number of the transistors included in the current track circuit 240, a resistance value of each of the transistors of the current track circuit 240, and the voltage level at the node Y (i.e., the RVL). In some embodiments, the current level of $I_{ref}$ tracks the current levels of $I_{on}$ and $I_{off}$ when the discharging path 287 and the leakage path 289 are formed, respectively, which will be described in further detail below.

Figure 3:
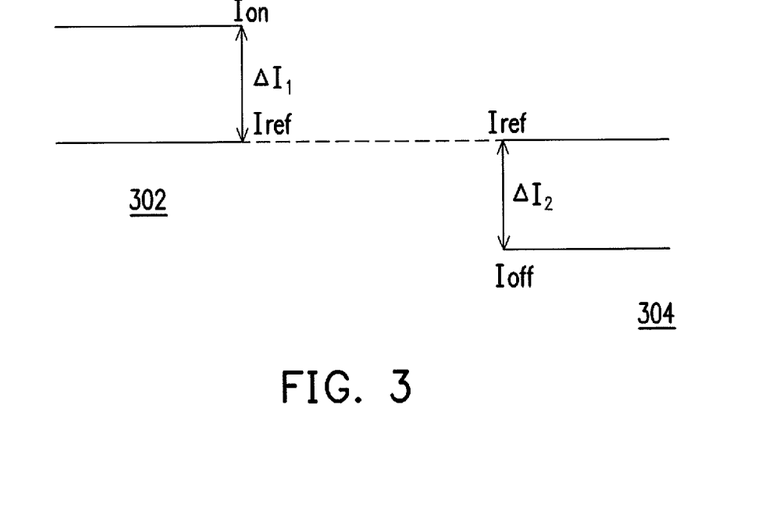
FIG. 3 illustrates exemplary current levels of a discharging current ($I_{on}$), a leakage current ($I_{off}$), and a reference current ($I_{ref}$), respectively, when the memory device 100 of FIG. 1 is accessed, in accordance with some embodiments.

As described above, in some embodiments, the transistor $M_{15}$ of the wake-up circuit 260 receives the short pulse signal 285 to quickly turn on and subsequently float the transistors $M_{10}$ and $M_{11}$ of the current mirror circuit 230, which causes the voltage level at the node Y (i.e., the RVL) to be suddenly pulled down to ground, and then gradually climb up to about 70% of Vdd. More specifically, the "70% of Vdd" of the RVL may be self-balanced by the transistor $M_{11}$ (and/or the transistor $M_{10}$) using the first voltage reference 201 to gradually charge the suddenly pulled gate voltage of the transistors $M_{10}$ and $M_{11}$. In some embodiments, the 70% of Vdd may be determined based on a voltage drop, which is about a threshold voltage of the transistor $M_{11}$, from Vdd, i.e., RVL=Vdd−threshold voltage of the transistor $M_{11}$. Thus, such 70% of Vdd of the RVL is merely an example. When a transistor or a device replaces the transistor $M_{11}$ that has a different threshold voltage or device characteristic, the RVL may vary accordingly. In some embodiments, once the RVL reaches a self-balanced level (e.g., about 70% of Vdd), the current track circuit 240 is biased under the self-balanced RVL, and $I_{ref}$ present on the current track path 291 may dynamically track $I_{on}$ and $I_{off}$. For example, when $I_{on}$ is present on the RBL 102-7 (i.e., the discharging path 287 is formed), the current level of $I_{ref}$ can always be lower than the current level of $I_{on}$, and keeps a substantially constant difference ($\Delta I_1$) from the current level of $I_{on}$, as shown in 302 of FIG. 3. This is because that, in some embodiments, the one or more transistors of the current track circuit 240 ($M_{12}$ and $M_{13}$) are each substantially identical to the read driver transistor $M_7$ and read transistor $M_8$ in terms of structures (e.g., physical dimensions of the channel, the gate electrode, the gate oxide, etc.), device profiles (e.g., materials used for the gate electrode, the gate oxide, doping concentrations/profiles for the drains/sources, etc.), etc., so that the resistance values of the transistors $M_7$ and $M_8$ of the bit cell 102-1, and the transistors $M_{12}$ and $M_{13}$ of the track circuit 240 are substantially identical to one another. Moreover, $I_{on}$ corresponds to a discharging rate that varies between Vdd and ground; and $I_{ref}$ corresponds to a rate that varies between the RVL (e.g., about 70% Vdd) and ground. Based on the Ohm's Law, the current levels of $I_{on}$ and $I_{ref}$ may remain substantially similar to the illustrated embodiment 302 of FIG. 3, wherein $\Delta I_1$ remains substantially constant. Similarly, when $I_{off}$ is present on the RBL 102-7 (i.e., the leakage path 289 is formed), the current level of $I_{ref}$ can always be higher than the current level of $I_{off}$, and keeps a substantially constant difference ($\Delta I_2$) from the current level of $I_{off}$, as shown in 304 of FIG. 3.

Although the track circuit 240 (FIG. 2B) is configured to keep the current level of $I_{ref}$ to be always sandwiched between the current levels of $I_{on}$ and $I_{off}$ and maintain respective constant difference ($\Delta I_1$ and $\Delta I_2$), in some alternative embodiments, the current level difference between $I_{ref}$ and either $I_{on}$ or $I_{off}$ may be subjected to change due to a variety of reasons. For example, when the memory device 100 is aged, the current level difference may change accordingly. However, according to various embodiments of the present disclosure, it is noted that the current level of $I_{ref}$ can always be sandwiched between the current levels of $I_{on}$ and $I_{off}$.

Although the illustrated embodiment of FIG. 2B shows that the track circuit 240 includes 2 serially coupled transistors $M_{12}$ and $M_{13}$ that are substantially identical to the transistors $M_7$ and $M_8$, it is understood any desired number of transistors may be included in the track circuit 240 to provide a respective current level of $I_{ref}$. For example, when the track circuit 240 includes 4 serially coupled transistors that are each substantially identical to the transistors $M_7$ and $M_8$, the current level of $I_{ref}$ may be about one-half of the current level of $I_{on}$. Still for example, when the track circuit 240 includes 8 serially coupled transistors that are each substantially identical to the transistors $M_7$ and $M_8$, the current level of $I_{ref}$ may be about one-quarter of the current level of $I_{on}$.

Once the "self-tacked" $I_{ref}$ is provided on the current track path 291, in some embodiments, the transistor $M_{11}$ of the current mirror circuit 230 mirrors $I_{ref}$ to the transistor $M_{10}$ of the current mirror circuit 230. Such a mirrored $I_{ref}$ is then provided to the RBL 102-7 through the already open switch circuit 220. Further, the sensing amplifier 106A, coupled to the bit cell 102-1 and the sub-reference circuit 104A through the RBL 102-7 (FIG. 1), uses the current level of $I_{ref}$ to differentiate $I_{on}$ and $I_{off}$ so as to determine the logical state of the data bit. For example, when $I_{on}$ is present and $I_{ref}$ is mirrored on the RBL 102-7, respectively, the sensing amplifier 106A determines whether the current level of Ion is higher than the current level of $I_{ref}$. In some embodiments, in response to the current level of $I_{on}$ being higher than the current level of $I_{ref}$, the sensing amplifier 106A may determine that the logical state of the data bit stored in the bit cell 102-1 is a logical 0. Similarly, when $I_{off}$ is present on and $I_{ref}$ is mirrored on the RBL 102-7, respectively, the sensing amplifier 106A determines whether the current level of $I_{off}$ is lower than the current level of $I_{ref}$. In some embodiments, in response to the current level of $I_{off}$ being lower than the current level of $I_{ref}$, the sensing amplifier 106A may determine that the logical state of the data bit stored in the bit cell 102-1 is a logical 1.

Figure 4:
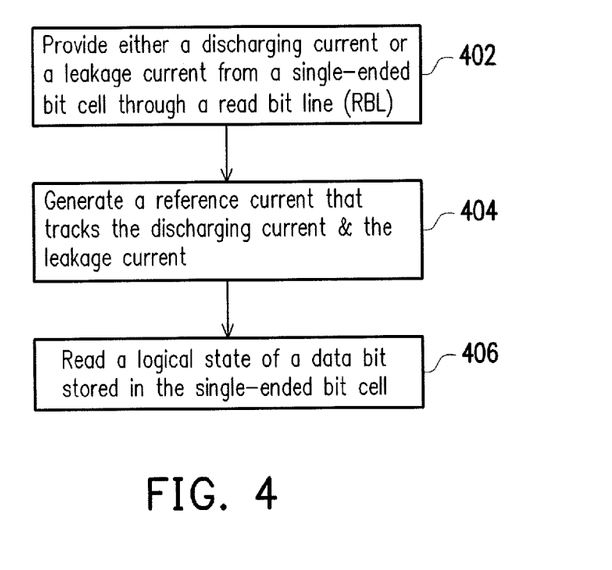
FIG. 4 illustrates a flow chart of a method to operate the memory device of FIG. 1, in accordance with various embodiments.

FIG. 4 illustrates a flow chart of a method 400 to read out a data bit from a first memory array using a reference row included in a second memory array, in accordance with various embodiments. In various embodiments, the operations of the method 400 are performed by the respective components illustrated in FIGS. 1-3. For purposes of discussion, the following embodiment of the method 400 will be described in conjunction with FIGS. 1-3. The illustrated embodiment of the method 400 is merely an example. Therefore, it should be understood that any of a variety of operations may be omitted, re-sequenced, and/or added while remaining within the scope of the present disclosure.

The method 400 starts with operation 402 in which either a discharging current or a leakage current is provided on a read bit line (RBL) coupled to a single-ended memory bit cell when a logical state of a data bit stored in the single-ended memory bit cell is to be read out, in accordance with various embodiments. Depending on the logical state, either a discharging current (i.e., $I_{on}$) or a leakage current (i.e., $I_{off}$) is present on the RBL (e.g., 102-7) of the single-ended memory bit cell (e.g., 102-1). For example, when the logical state of the data bit is at a first logical state (e.g., a logical 0), a discharging path (e.g., 287) is formed and thus $I_{on}$ is present on the RBL 102-7; when the logical state of the data bit is at a second logical state (e.g., a logical 1), a leakage path (e.g., 289) is formed and thus $I_{off}$ is present on the RBL 102-7, as described above.

The method 400 continues to operation 404 in which a self-tracked reference current ($I_{ref}$) is generated and provided by a reference circuit coupled to the single-ended memory bit cell, in accordance with various embodiments. Continuing with the above example, the self-tracked $I_{ref}$ is provided by the sub-reference circuit 104A and then mirrored to the RBL 102-7 by the current mirror circuit 230. In some embodiments, even though the single-ended memory bit cell 102-1 is accessed under a wide range of operation window, the current level of $I_{ref}$ is always lower than the current level of $I_{on}$, and higher than the current level of $I_{off}$ such that $I_{ref}$ can self-track the discharging current ($I_{on}$) and the leakage current ($I_{off}$).

The method 400 continues to operation 406 in which a sensing amplifier (e.g., 106A), coupled to the single-ended memory bit cell and the reference circuit via the RBL, reads out the logical state of the data bit by suing the current levels of $I_{ref}$ and either $I_{on}$ or $I_{off}$, in accordance with various embodiments. As described above, for example, the sensing amplifier 106A reads out a logical 0 when the current level of $I_{on}$ is higher than $I_{ref}$, and a logical 1 when the current level of $I_{off}$ is lower than $I_{ref}$.

In an embodiment, a memory device is disclosed. The memory device includes a memory cell that is configured to store a data bit, comprising at least one read transistor that is configured to form either a discharging path or a leakage path when the data bit is read; a conductive line coupled to the read transistor; and at least a first track transistor, coupled to the conductive line, and configured to provide a first current signal having a first current level that tracks a second current level of a second current signal, wherein the second current signal is provided when either one of the discharging and leakage paths is formed, and wherein the first the second current signals are used to determine a logical state of the data bit.

In another embodiment, a memory device includes a memory cell that is configured to store a data bit and comprises at least one read transistor that is configured to form either a discharging path or a leakage path when the data bit is read; a read bit line (RBL) coupled to the at least one read transistor; and a reference circuit comprising a number of serially coupled track transistors, wherein the serially coupled track transistors are coupled to the RBL, and configured to provide a first current signal having a first current level that tracks a second current level of a second current signal, wherein the second current signal is provided when either one of the discharging and leakage paths is formed, and wherein the first the second current signals are used to determine a logical state of the data bit.

Yet in another embodiment, a method to operate a memory device includes providing either a discharging current signal or a leakage current signal from a memory cell of the memory device; generating a reference current signal that tracks the discharging current signal and the leakage current signal; and determining a logical state of a data bit stored in the memory cell using the reference current signal and either the discharging current signal or the leakage current signal.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory device, comprising:
 a memory cell that is configured to store a data bit, comprising at least one read transistor that is configured to form either a discharging path or a leakage path when the data bit is read;

a conductive line coupled to the read transistor; and a first track transistor serially coupled to one or more track transistors, the first track transistor coupled to the conductive line and configured to provide a first current signal having a first current level that tracks a second current level of a second current signal, wherein the second current signal is provided when either one of the discharging and leakage paths is formed, and wherein the first and the second current signals are used to determine a logical state of the data bit.

2. The memory device of claim 1, wherein the first current signal flows through the conductive line, and the second current signal flows through the read transistor and the conductive line.

3. The memory device of claim 1, wherein the memory cell includes a single-ended memory cell.

4. The memory device of claim 1, wherein the conductive line includes a read bit line (RBL).

5. The memory device of claim 1, wherein the read transistor and the first track transistor are substantially identical to each other.

6. The memory device of claim 1, wherein when the first current signal is provided, the first track transistor is biased at a self-balanced reference voltage that is about a threshold voltage drop from a power supply voltage applied to the memory device.

7. The memory device of claim 1, wherein the second current signal includes a discharging current signal when the discharging path is formed, and a leakage current signal when the leakage path is formed.

8. The memory device of claim 1, further comprising:

a sensing amplifier, coupled to the memory cell and the first track transistor through the conductive line, and configured to determine the logical state of the data bit as a first logical state when the first current level is lower than the second current level, and as a second logical state when the first current level is higher than the second current level.

9. The memory device of claim 1, wherein the first track transistor and the one or more track transistors are each substantially identical to the read transistor so as to assure the first current level is lower than the second current level when the second current signal includes a discharging current signal, and the first current level is higher than the second current level when the second current signal includes a leakage current signal.

10. The memory device of claim 1, wherein the current levels of the first and second current signals are separated by a substantially constant difference.

11. A memory device, comprising:

a memory cell that is configured to store a data bit and comprises at least one read transistor that is configured to form either a discharging path or a leakage path when the data bit is read;

a read bit line (RBL) coupled to the at least one read transistor; and a reference circuit comprising a number of serially coupled track transistors, wherein the serially coupled track transistors are coupled to the RBL, and configured to provide a first current signal having a first current level that tracks a second current level of a second current signal, wherein the second current signal is provided when either one of the discharging and leakage paths is formed, and wherein the first the second current signals are used to determine a logical state of the data bit.

12. The memory device of claim 11, wherein the memory cell includes a single-ended memory cell.

13. The memory device of claim 11, wherein the read transistor and the serially coupled track transistors are substantially identical to one another.

14. The memory device of claim 11, wherein when the first current signal is provided, the serially coupled track transistors are biased at a self-balanced reference voltage that is about a threshold voltage drop from a power supply voltage applied to the memory device.

15. The memory device of claim 11, wherein the second current signal includes a discharging current signal when the discharging path is formed, and a leakage current signal when the leakage path is formed.

16. The memory device of claim 11, further comprising:

a sensing amplifier, coupled to the memory cell and the serially coupled track transistors through the RBL, and configured to determine the logical state of the data bit as a first logical state when the first current level is lower than the second current level, and as a second logical state when the first current level is higher than the second current level.

17. The memory device of claim 11, wherein the current levels of the first and second current signals are separated by a substantially constant difference.

18. A method to operate a memory device, comprising:

providing either a discharging current signal or a leakage current signal from a memory cell of the memory device;

generating a reference current signal that tracks the discharging current signal and the leakage current signal using serially coupled track transistors; and determining a logical state of a data bit stored in the memory cell using the reference current signal and either the discharging current signal or the leakage current signal.

19. The method of claim 18, wherein current levels of the discharging current signal and the leakage current signal are each separated from a current level of the reference current signal by a substantially constant difference.

20. The method of claim 18, wherein the memory cell includes a single-ended memory cell.

* * * * *